United States Patent [19]

Shoji et al.

[11] 4,321,319

[45] Mar. 23, 1982

[54] PHOTOSENSITIVE COMPOSITIONS CONTAINING POLYAMIDES ACID WITH PHOTOSENSITIVE GROUPS

[75] Inventors: Fusaji Shoji; Issei Takemoto; Hitoshi Yokono, all of Yokohama; Tokio Isogai, Fujisawa, all of Japan

[73] Assignee: Hitachi, Ltd., Tokyo, Japan

[21] Appl. No.: 198,952

[22] PCT Filed: Sep. 26, 1979

[86] PCT No.: PCT/JP79/00246

§ 371 Date: May 22, 1980

§ 102(e) Date: May 22, 1980

[87] PCT Pub. No.: WO80/00706

PCT Pub. Date: Apr. 17, 1980

[30] Foreign Application Priority Data

Sep. 29, 1978 [JP] Japan ................. 53-119218
Sep. 29, 1978 [JP] Japan ................. 53-119219
Apr. 11, 1979 [JP] Japan ................. 54-43022

[51] Int. Cl.$^3$ .............................. G03C 1/68
[52] U.S. Cl. ........................ 430/270; 430/283; 204/159.19; 528/184; 528/185; 528/170; 528/208; 528/211; 528/322; 528/327; 528/331; 528/340; 528/342; 528/350; 528/353

[58] Field of Search ................... 430/270, 283; 204/159.19; 528/184, 185, 170, 208, 211, 322, 327, 331, 340, 342, 350, 353

[56] References Cited

U.S. PATENT DOCUMENTS

| | | | |
|---|---|---|---|
| 3,623,870 | 11/1971 | Curran et al. | 430/330 |
| 3,957,512 | 5/1976 | Kleeberg et al. | 430/325 |
| 4,040,831 | 8/1977 | Rubner et al. | 430/283 |
| 4,242,437 | 12/1980 | Rohloft | 430/270 |

*Primary Examiner*—Jack P. Brammer
*Attorney, Agent, or Firm*—Craig and Antonelli

[57] ABSTRACT

There is described photosensitive polymer composition and a polyimide film-coated material made by applying the composition to a support, irradiating with ultraviolet and thereafter heating. The photosensitive polymer composition is prepared by adding a sensitizer to a photosensitive polyamide acid intermediate solution which is obtained by reacting in an inert solvent a first compound comprising 100 to 5% by weight of a photosensitive group-containing diamine and 0 to 95% by weight of a diamine having no photosensitive group, with a second compound comprising at least one compound selected from a tetracarboxylic acid dianhydride and a tricarboxylic acid anhydride monohalide.

7 Claims, No Drawings

PHOTOSENSITIVE COMPOSITIONS CONTAINING POLYAMIDES ACID WITH PHOTOSENSITIVE GROUPS

TECHNICAL FIELD

The present invention relates to a new photosensitive polymer composition and to a support having thereon a cured film of this polymer composition.

BACKGROUND ART

As regards photosensitive polyimide, there have so far been known (a) the one prepared by coating a base plate with a mixture of 95–99 wt% of a polyamide acid type intermediate and 1–5 wt% of a dichromate, the coating being then irradiated with ultraviolet light, developed, if necessary, with hexamethylphosphoramide, and heated at 250° C. (U.S. Pat. No. 3,623,870), and (b) the other one prepared by coating a base plate with a polyamide acid intermediate having a photosensitive group in the molecule, the coating being then cured in the same way as in the case of (a) (DE-OS No. 2308830).

However, the above-said composition (a) has difficulty of handling due to instability of said mixture and problem of insulating properties due to the remaining dichromate in the cured coating. Also, in the above-said (b), it was necessary to use pure materials (1) and (2) below in case, for example, where said photosensitive polyamide acid intermediate is synthesized by addition polycondensation or by polycondensation of an isomeric mixture of dicarboxylic acid dichloride derivatives represented by the following formula (1) having photosensitive groups

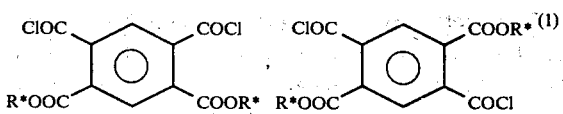

(wherein R* is a group

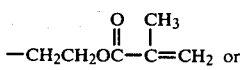

or

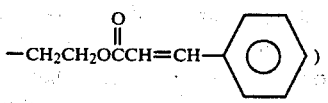

with the polyfunctional ring compound of the following formula (2),

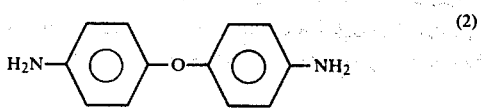

in order to increase the molecular weight of the resulting photosensitive polyamide acid intermediate. However, the above compounds (1) are difficult to purify because of the high viscousness and the moisture-labile character; in addition, compound (1) has a disadvantage of requiring a high cost for their production, which is practiced in many steps through the following reactions (3):

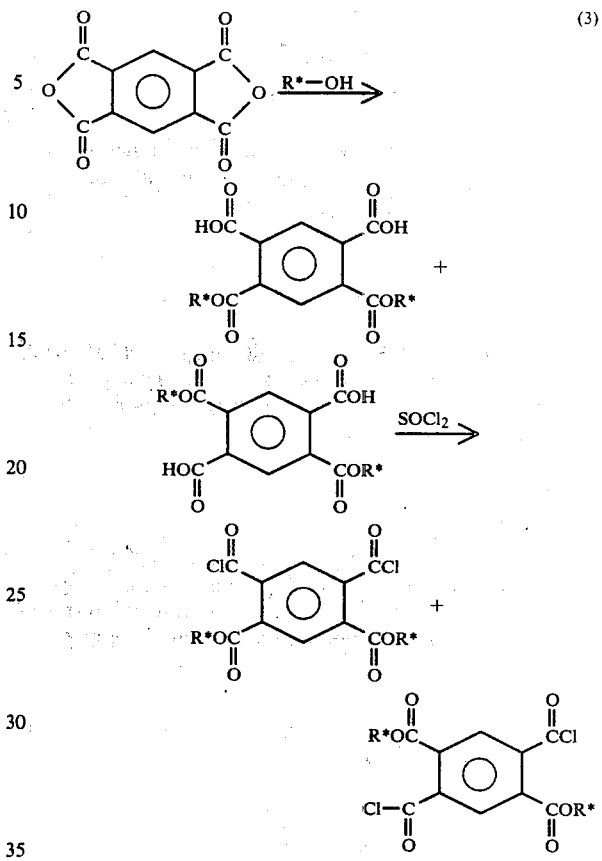

(wherein R* is a group

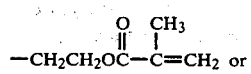

or

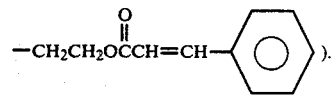

The object of this invention is to provide an inexpensive composition of photosensitive polymer without any of such disadvantages of the prior arts and to provide cured film thereof formed on a supporting material.

DISCLOSURE OF INVENTION

This invention is characterized in that a diamine having a photosensitive group is essentially used. That is, this invention is achieved by in the following process comprising:

(a) preparing a photosensitive polymer composition by blending a photosensitive polyamide acid intermediate solution in an inert organic solvent with a sensitizer (in a ratio of 80–99.5 wt% of said intermediate to 0.5–20 wt% of the sensitizer), said intermediate being obtained by reacting in an inert solvent; a first compound comprising 100–5 wt% preferably 100–60 wt% of a photosensitive group-containing diamine, which is represented by the general formula

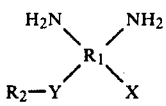

(wherein $R_1$ is a trivalent or tetravalent group having at least 2 carbon atoms, $R_2$ is a photosensitive group, Y is a radical selected from

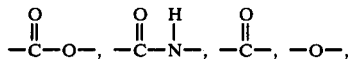

and —$CH_2O$—, and X is a —Y—$R_2$ group or H atom) and 0–95 wt%, preferably 0–40 wt% of a diamine having no photosensitive group, which is represented by the general formula

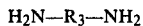

(wherein $R_3$ is a divalent group having at least 2 carbon atoms and the two amino groups are bound to different carbon atoms in $R_3$, respectively); with a second compound selected from at least one compound of a tetracarboxylic acid dianhydride represented by the general formula

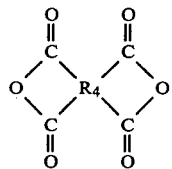

(wherein $R_4$ is a tetravalent group having at least 4 carbon atoms), and a tricarboxylic acid anhydride monohalide represented by the general formula

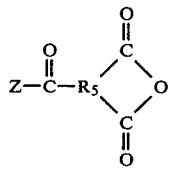

(wherein $R_5$ is a trivalent group having at least 2 carbon atoms, and Z is a halogen atom), and (b) irradiating said photosensitive polymer composition with ultraviolet light to bind the photosensitive polyamide acid intermediate molecules with one another into crosslinked molecules and further heating the resulting composition to about 200° C. or more, preferably at 200°–350° C. (where heating between 200° and 350° C. is carried out in an inert gas), to transform the composition into a polyimide through the intra-molecular dehydrating reaction.

In this case, the intrinsic viscosity of said polyamide acid intermediate used is at least 0.1, preferably 0.3–5.0, wherein the intrinsic viscosity is calculated according to the following equation through the determination of viscosities at 30° C. of N,N-dimethylacetoamide solution containing 0.5% of the photosensitive polyamide acid intermediate and of N,N-dimethylacetamide (solvent):

$$\text{Intrinsic viscosity} = \frac{1}{C} \ln \frac{\text{solution viscosity}}{\text{solvent viscosity}}$$

(where C is the concentration of the photosensitive polyamide acid intermediate in gram/100 ml of the solution).

The melting point of the photosensitive polyamide acid intermediate having such a value of intrinsic viscosity does not indicate a fixed value.

The photosensitive polymer composition used in this invention can be prepared in the following way: Either a mixture (the first compound) of 100–5 wt% of a diamine having a photosensitive group and 0–95 wt% of a diamine having no photosensitive group or at least one compound (the second compound) selected from the tetracarboxylic acid dianhydrides and the tricarboxylic anhydride monohalides is dissolved in an inert organic solvent sufficiently as completely as possible. While the temperature of the reaction system is kept below about 80° C., preferably at room temperature or less, another component is added thereto and the mixture is stirred. Thereby the reaction proceeds fast and the viscosity of the reaction mixture increases gradually with formation of a photosensitive polyamide acid intermediate, giving its solution in an inert organic solvent. A sensitizer is added thereto (in a ratio of 80–99.5 wt% of the intermediate to 0.5–20 wt% of the sensitizer) to make up the objective photosensitive polymer composition.

This photosensitive polymer composition is then applied onto a support, dried (preferably at a temperature below 100° C.; any heating means can be applied) to vaporize the solvent, and thereafter irradiated with ultraviolet light and further heated at least at 200° C. In case of forming a pattern, a suitable mask is placed on the coating and the system is irradiated with ultraviolet light, subsequently treated with a developer and a rinsing liquid, and further heated at least at 200° C.

Therein, the irradiation with ultraviolet light is carried out, for example, by means of 1 kW high-voltage mercury lamp, but any other light source that generates actinic ray can be used. The intensity of the incident light is desirable to be 3–50 mW/cm² and the time of exposure is about 30 sec to 10 min.

The above-mentioned chemical reactions are shown in chemical reaction equation as follows:

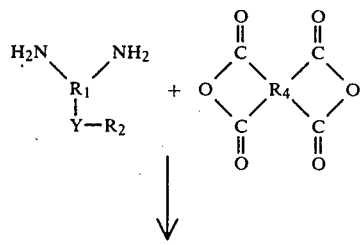

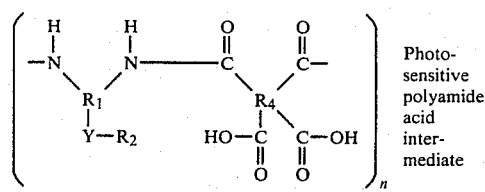
Photosensitive polyamide acid intermediate
↓ hν
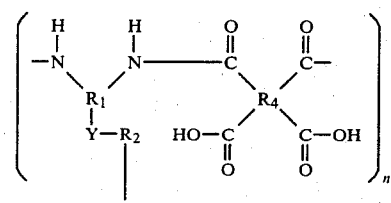
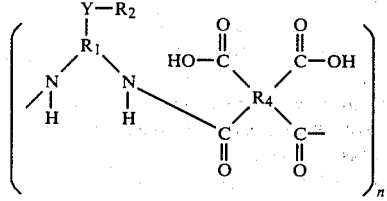
↓ heat
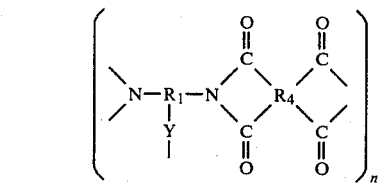
The photosensitive polyamide acid intermediates thus obtained exist in various different forms as shown in the following general formulae, depending upon the kinds of the first and second compound used.
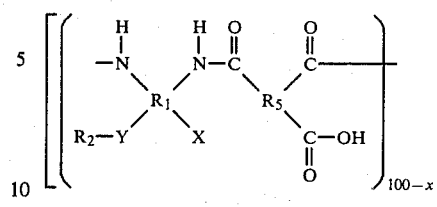
or
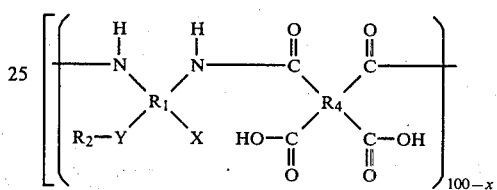
or
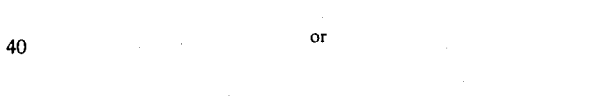
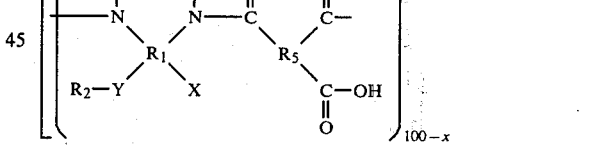
or
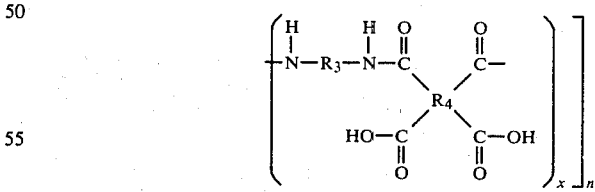
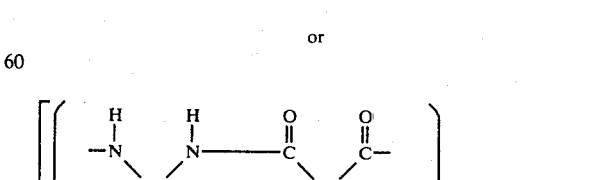
or
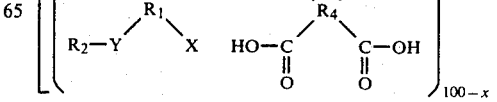

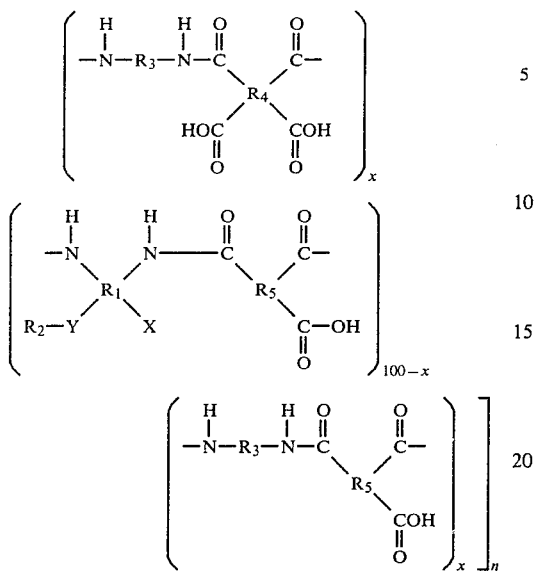

(wherein $R_1$ is a trivalent or tetravalent group having at least 2 carbon atoms, $R_2$ is a photosensitive group, Y is a radical selected from

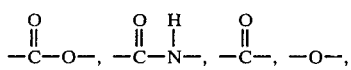

and $-CH_2O-$, $R_3$ is a divalent group having at least 2 carbon atoms, $R_4$ is a tetravalent group having at least 4 carbon atoms, $R_5$ is a trivalent group having at least 2 carbon atoms, X is a $-Y-R_2$ group or H, x is a number between 0 and 95 inclusive, and n is a positive integer).

The materials used in this invention are illustrated below:

As the diamines having a photosensitive group, for example, the following compounds are cited:

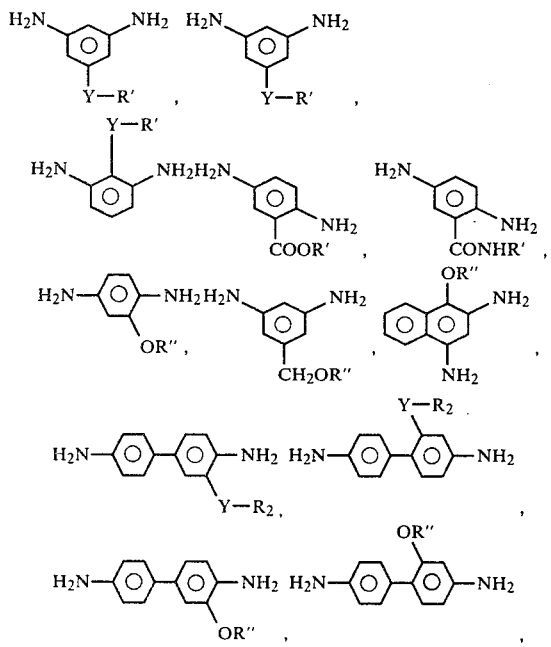

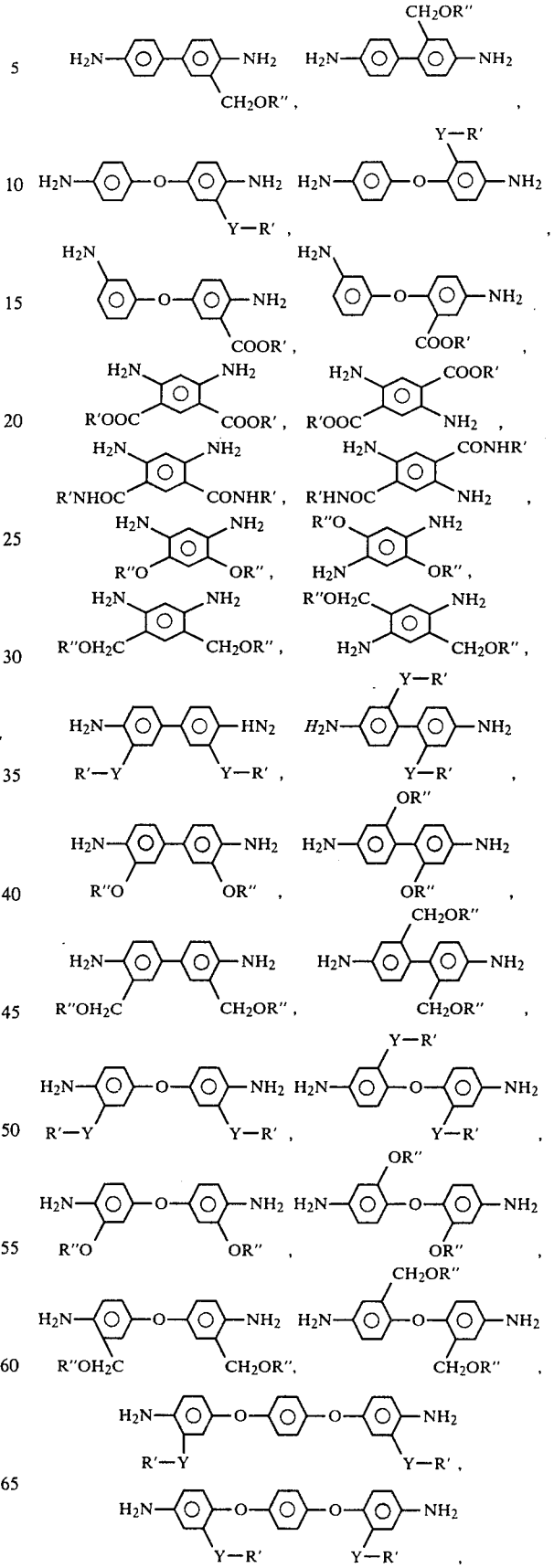

-continued

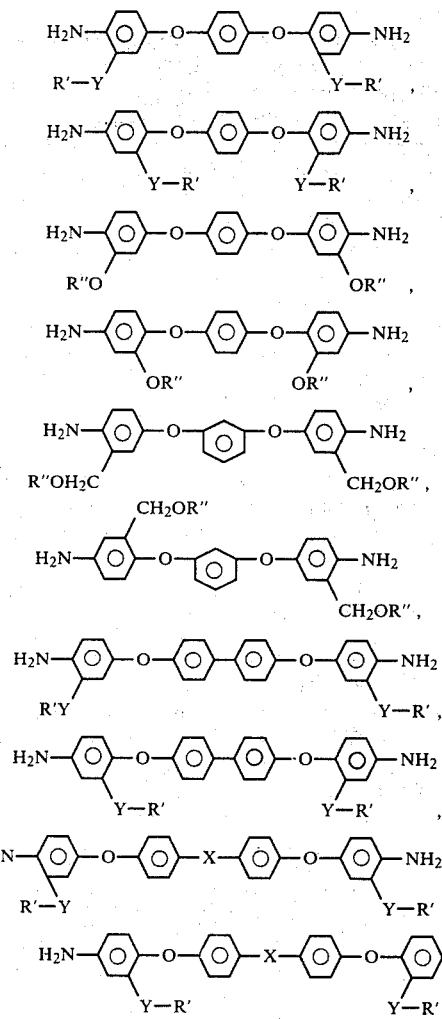

(wherein Y is a radical selected from $-\overset{O}{\underset{\|}{C}}-O-$, $-\overset{O}{\underset{\|}{C}}-\overset{H}{\underset{|}{N}}-$, $-\overset{O}{\underset{\|}{C}}-$, $-O-$, and $-CH_2O-$, and when Y is $-\overset{O}{\underset{\|}{C}}-O-$ or $-\overset{O}{\underset{\|}{C}}-\overset{H}{\underset{|}{N}}-$, R' is $-CH_2CH_2O-\overset{O}{\underset{\|}{C}}-CH=CH_2$, $-CH_2CH_2O-\overset{O}{\underset{\|}{C}}-\underset{\underset{CH_3}{|}}{C}=CH_2$,

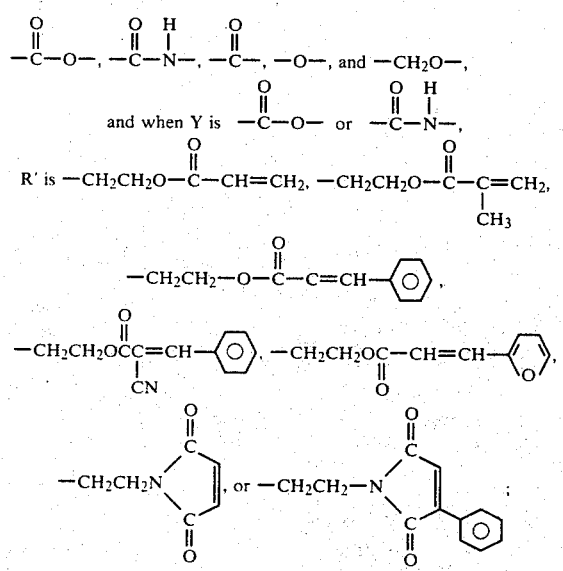

-continued when Y is $-\overset{O}{\underset{\|}{C}}-$, R' is $-CH=CH_2$, $-\underset{\underset{CH_3}{|}}{C}=CH_2$,

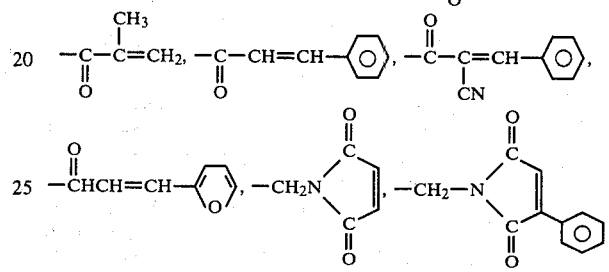

and when Y is $-O-$ or $-CH_2O-$, R" is $-\overset{O}{\underset{\|}{C}}-CH=CH_2$,

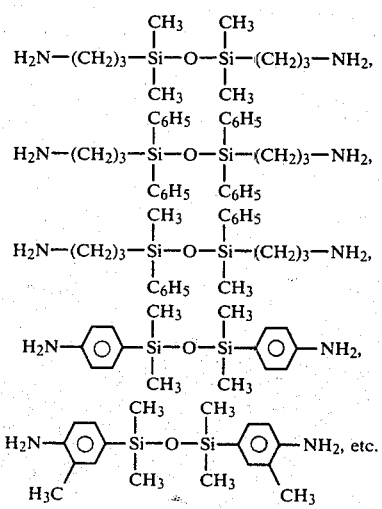

or others).

As examples of the diamine having no photosensitive group, the following compounds are cited: m-phenylenediamine, p-phenylenediamine, 4,4'-diaminodiphenyl ether, 4,4'-diaminodiphenylpropane, 4,4'-diaminodiphenyl sulfone, 4,4'-diaminodiphenyl sulfide, benzidine, 4,4'-di(m-aminophenoxy)diphenyl sulfone, 4,4'-di(p-aminophenoxy)diphenylpropane, 1,5-diaminonaphthalene, 3,3'-dimethyl-4,4'-diphenyldiamine, 3,3'-dimethoxybenzidine, m-xylylenediamine, p-xylylenediamine, hexamethylenediamine, heptamethylenediamine, octamethylenediamine, $H_2N-(CH_2)_3-\underset{\underset{CH_3}{|}}{\overset{\overset{CH_3}{|}}{Si}}-O-\underset{\underset{CH_3}{|}}{\overset{\overset{CH_3}{|}}{Si}}-(CH_2)_3-NH_2$, $H_2N-(CH_2)_3-\underset{\underset{C_6H_5}{|}}{\overset{\overset{C_6H_5}{|}}{Si}}-O-\underset{\underset{C_6H_5}{|}}{\overset{\overset{C_6H_5}{|}}{Si}}-(CH_2)_3-NH_2$, $H_2N-(CH_2)_3-\underset{\underset{C_6H_5}{|}}{\overset{\overset{CH_3}{|}}{Si}}-O-\underset{\underset{CH_3}{|}}{\overset{\overset{C_6H_5}{|}}{Si}}-(CH_2)_3-NH_2$,

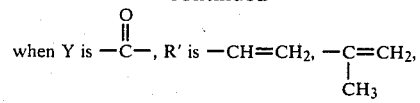

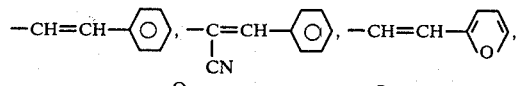

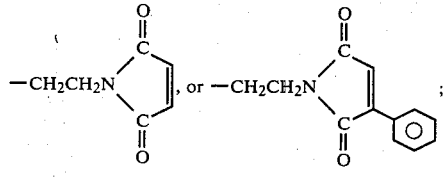

The reason for specifying the blending ratio of the diamine having a photosensitive group to the diamine having no photosensitive group as 100-5 wt% of the former to 0-95 wt% of the latter is due to the fact that, when the latter content exceeds 95 wt%, the photosensitive polymer composition is less sensitive to ultraviolet light and at the same time the resistance against a developer, of the portions exposed to ultraviolet irradiation is poorer.

The reason for specifying the preferred blending ratio of the diamine having a photosensitive group to the diamine having no photosensitive group as 100–60 wt% of the former to 0–40 wt% of the latter is due to the fact that this range gives best sensitivity and best resistance against a developer.

As the carboxylic acid dianhydride, there are mentioned, for example, dianhydride of pyromellitic acid, 2,2-bis(3,4-dicarboxyphenyl) propane, bis(3,4-dicarboxyphenyl) ether, bis(3,4-dicarboxyphenyl) sulfone, 3,3',4,4'-benzophenone tetracarboxylic acid, 3,3',4,4'-biphenyltetracarboxylic acid, 2,2',3,3'-biphenyltetracarboxylic acid, 1,2,5,6-naphthalene tetracarboxylic acid, 2,3,6,7-naphthalene tetracarboxylic acid, 3,4,9,10-perylene tetracarboxylic acid, 2,2',6,6'-biphenyl tetracarboxylic acid, 2,2-bis(3,4-dicarboxyphenyl) hexafluoropropane or others.

As the tricarboxylic acid anhydride monohalide, there are mentioned, for example, monohalides of the following compounds such as trimellitic anhydride, 2,3,6-naphthalene tricarboxylic anhydride, 2,3,5-naphthalene tricarboxylic anhydride, 2,2',3-biphenyl tricarboxylic anhydride, 3,4,4'-biphenyl tricarboxylic anhydride, 2-(3,4-dicarboxyphenyl)-2-(3-carboxyphenyl) propane anhydride, 1,2,4-naphthalene tricarboxylic anhydride, 1,4,5-naphthalene tricarboxylic anhydride, 2-(2,3-dicarboxyphenyl)-2-(3-carboxyphenyl) propane anhydride, 1-(2,3-dicarboxyphenyl)-1-(3-carboxyphenyl) ethane anhydride, 1-(3,4-dicarboxyphenyl)-1-(4-carboxy-phenyl) ethane anhydride, (2,3-dicarboxyphenyl)(2-carboxyphenyl) methane anhydride, 1,2,3-benzene tricarboxylic anhydride, 3,3',4-tricarboxybenzophenone anhydride, etc.

When a first compound comprising a diamine having a photosensitive group and a diamine having no photosensitive group in a ratio of 100–5 wt% to 0–95 wt%, preferably 100–60 wt% of the former to 0–40 wt% of the latter is blended with an equivalent amount of a second compound consisting of at least one compound selected from tetracarboxylic dianhydrides and tricarboxylic anhydride monocarboxylic acid halides, the polymerization degree of the photosensitive polyamide acid intermediate is favorably larger, but it is unobjectionable to use either of the first and second compounds in somewhat excess amount.

The inert organic solvent used is required to be capable of dissolving all components of the first and second compounds mentioned above. A particularly favorable one is a solvent capable of dissolving the resulting photosensitive polyamide acid intermediate, such as, for example, N-methyl-2-pyrrolidone, 1,3-dimethyl-2-imidazolidinone, N,N-dimethylacetamide, N-methylformamide, N,N-dimethylformamide, dimethyl sulfoxide, hexamethylphosphoramide, tetramethylene sulfone, dimethyl sulfone, pyridine, tetramethylurea, N-acetyl-2-pyrrolidone, etc.

These solvents can be used each alone or in combination with one another or with a solvent such as benzene, toluene, nitrotoluene, chlorobenzene, cyclohexanone, etc, added. As regards the amount of the solvent used for the polymerization, there is no particular restriction as far as it is sufficient to give a good polymerization system. When the solvent is used in such an amount that the solute content in the resulting solution is in the range from 0.1 to 40 wt%, a high molecular weight photosensitive polyamide acid intermediate can usually be obtained.

The photosensitive polymer composition of this invention contains a sensitizer. In the presence of a sensitizer, though the stability of the composition depends on the kind of the photosensitive group, the composition is always stable under the light-shielded condition at room temperature. It is also possible to add a stabilizer such as, for example, hydroquinone or tert-butyl catechol, to increase the stability.

At least one of sensitizers such as the following examples may be used: anthraquinone, 2-methylanthraquinone, 2-ethylanthraquinone, benzoquinone, 1,2-naphthoquinone, 1,4-naphthoquinone, 1,2-benzoanthraquinone, acetophenone, benzophenone, p,p'-diaminobenzophenone, p,p'-dimethylamino benzophenone, p,p'-tetramethyldiaminobenzophenone (Michler's ketone), 2-nitrofluorene, 5-nitroacenaphthene, 4-nitro-1-naphthylamine, N-acetyl-4-nitro-1-naphthylamine-p-nitroaniline, 2-chloro-4-nitroaniline, pycramide, 2-t-butylanthraquinone, 1,2-benzanthraquinone, anthrone, 1,9-benzoanthrone, 3-methyl-1,3-diaza-1,9-benzoanthrone, dibenzalacetone, etc.

The blending ratio of the sensitizer to the photosensitive polyamide acid intermediate is desirably 0.5–20 wt% of the former to 80–99.5 wt% of the latter. When the sensitizer content is less than 0.5 wt%, the sensitizing effect does not appear, while, if the content exceeds 20 wt%, an adverse effect appears on the characteristics of the cured film. The photosensitive polymer of this invention may be incorporated with a dyestuff, a pigment, or a colorant.

The supports usable in this invention are, for example, metals, glass, semiconductors (for example, silicon wafer and germanium wafer), ceramics, plastics, paper, conductive films (for example, $In_2O_3$), metal oxide insulators (for example, $TiO_2$, $Ta_2O_5$, silicon oxides), silicon nitride, etc.

The application of the photosensitive polymer composition on an above-said support is carried out by a usual means such as spinner coating, immersion, spraying, printing or the like. Such application means are chosen according to the solid concentration and viscosity of the photosensitive polymer composition. The cured film thickness can be controlled by application means, and the solid concentration and viscosity of the photosensitive polymer composition.

The development after irradiation with ultraviolet light, of the coating on the support is carried out by a polymerization solvent such as, for example, N-methyl-2-pyrrolidone, N,N-diamethylacetoamide, N,N-dimethylformamide, etc. Such a solvent can optionally be used in incorporation with acetone, ethanol, or the like.

The rinsing liquid serves to wash away the developer solvent and it is preferable to use as the rinsing liquid a solvent such as toluene, acetone or ethanol, which is relatively well compatible with the developer solvent.

BEST MODE FOR CARRYING THE INVENTION

The invention is further illustrated by way of the following Examples.

EXAMPLE 1

In a 100-ml flask equipped with a thermometer, a stirrer, a calcium chloride tube, and a nitrogen inlet tube, 2.64 g (0.01 mol) of 2-(3',5'-diaminobenzoyloxy) ethylmethacrylate and 48.2 g of N-methyl-2-pyrrolidone were placed and thoroughly stirred to dissolve the former. After the dissolution had been completed, 1.1 g (0.005 mol) of pyromellitic dianhydride and 1.61 g (0.005 mol) of 3,3',4,4'-benzophenone tetracarboxylic dianhydride were added slowly under cooling of the flask with ice. Thereafter, the reaction was conducted at 15° C. for 6 hours, whereby an inert organic solvent solution of a photosensitive polyamide acid intermediate (a photosensitive polymer composition) was obtained.

The intrinisc viscosity of the photosensitive polyamide acid intermediate thus obtained was 0.85 (0.5% N,N-dimethylacetamide solution at 30° C.).

The viscosity of said photosensitive polymer composition was adjusted to 1000 cp (25° C.), and the resulting composition was applied on a silicon wafer by means of a spinner. The coated wafer was dried at 80° C. for 40 minutes to volatilize the solvent away and to complete the coating. This coating was covered with a mask having a desired pattern and irradiated with ultraviolet light at an incident beam intensity of 20 mW/cm² for 5 minutes by the use of a high-voltage mercury lamp to give a crosslinked polyamide acid coating.

Subsequently, the crosslinked coating was developed with a mixture of 3 volumes of N-methyl-2-pyrrolidone and 1 volume of ethanol and washed with a rinsing liquid (ethanol). Thereafter, the crosslinked coating was heated at 250° C. for 60 minutes to give a polyimide coating pattern.

This coating was flat and uniform (good coating quality), and the precision of the pattern was also good.

EXAMPLE 2

Starting materials were formulated as shown in Table 1, Nos. 1-3, and thereafter were processed in the same way as in Example 1. The results obtained are shown in Table 2, Nos. 1-3. From these results, it is proved that good blending ratios of the diamine having a photosensitive group to the diamine having no photosensitive group are in the range of 100-5 wt% of the former to 0-95 wt% of the latter.

EXAMPLE 3

Starting materials were formulated as shown in Table 1, Nos. 4-7, and thereafter were processed in the same way as in Example 1. The results obtained are shown in Table 2, Nos. 4-7. From these results and the results of Example 1, it is proved that good blending ratios of the sensitizer to the photosensitive polyamide acid intermediate is in the range of 0.5-20 wt% of the former to 80-95 wt% of the latter.

EXAMPLE 4

Various starting materials were formulated as shown in Table 3, Nos. 8-15, in Table 5, Nos. 16-23, in Table 7, Nos. 24-31, and in Table 9, Nos. 32-38, and thereafter were processed in the same way as in Example 1. The results obtained are shown in Table 4, Nos. 8-15, in Table 6, Nos. 16-23, in Table 8, Nos. 24-31, and in Table 10, Nos. 32-38.

TABLE 1

| No. | Diamine having a photosensitive group g (mol) | Diamine having no photosensitive group g (mol) | Acid anhydride g (mol) | Polymer in solution wt% |
|---|---|---|---|---|
| 1 | 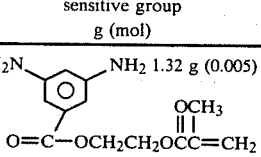 1.32 g (0.005) | 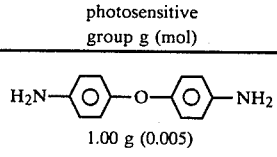 1.00 g (0.005) | 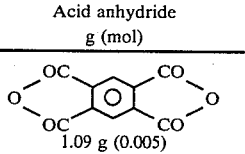 1.09 g (0.005) 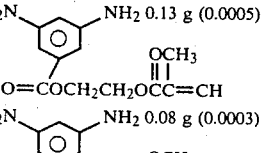 1.61 g (0.005) | N-methyl-2-pyrrolidone 10 |
| 2 | 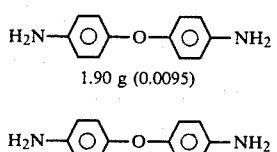 0.13 g (0.0005) | 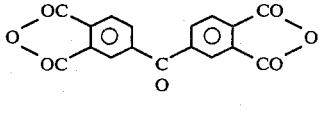 1.90 g (0.0095) | " | N-methyl-2-pyrrolidone 10 |
| 3 | 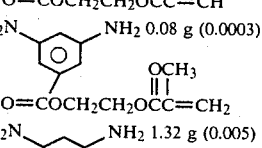 0.08 g (0.0003) | 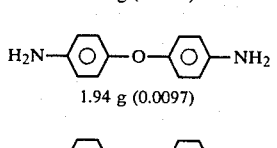 1.94 g (0.0097) | " | N-methyl-2-pyrrolidone 10 |
| 4 | 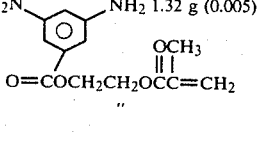 1.32 g (0.005) | 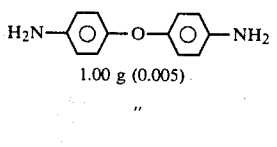 1.00 g (0.005) | " | N-methyl-2-pyrrolidone 10 |
| 5 | " | " | " | N-methyl-2-pyrrolidone 10 |
| 6 | " | " | " | N-methyl-2-pyrrolidone 10 |
| 7 | " | " | " | N-methyl-2-pyrrolidone 10 |

TABLE 2

| No. | Intrinsic viscosity of polymer | Sensitizer (wt % based on polymer) | Coating quality (supporting material) | Precision of pattern |
|---|---|---|---|---|
| 1 | 0.87 | 2-methylanthraquinone (8) | good (silicon wafer) | good |
| 2 | 0.90 | 2-methylanthraquinone (8) | good (silicon wafer) | good |
| 3 | 1.01 | 2-methylanthraquinone (8) | good (silicon wafer) | inferior |
| 4 | 0.85 | 2-methylanthraquinone (0.1) | good (silicon wafer) | inferior |
| 5 | " | 2-methylanthraquinone (0.5) | good (silicon wafer) | good |
| 6 | " | 2-methylanthraquinone (20) | good (silicon wafer) | good |
| 7 | " | 2-methylanthraquinone (30) | good (silicon wafer) | inferior |

TABLE 3
| No. | Diamine having a photo-sensitive group g (mol) | Diamine having no photosensitive group g (mol) | Acid anhydride g (mol) | Polymer in solution wt% |
|---|---|---|---|---|
| 8 | 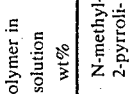 2.11 g (0.008) | 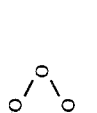 0.82 g (0.0019) | 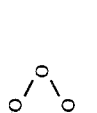 1.09 g (0.005) | N-methyl-2-pyrrolidone 14.0 |
| 9 | 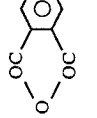 3.26 g (0.01) | — | 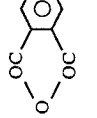 1.6 g (0.005) | N-methyl-2-pyrrolidone 15.0 |
| 10 | 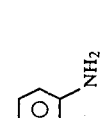 3.16 g | — | 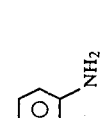 2.18 g (0.01) | N,N-dimethyl-acetamide 15.0 |
| 11 | 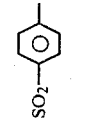 1.63 g (0.005) | 1.0 g (0.005) | 3.22 g (0.01) " | N-methyl-2-pyrrolidone 15.0 |
| 12 | 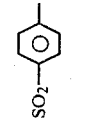 2.6 g (0.008) | 0.4 g (0.002) | 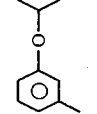 1.09 g (0.005) 1.61 g (0.005) | N-methyl-2-pyrrolidone 13.0 |

TABLE 3-continued

| No. | Diamine having a photo-sensitive group g (mol) | Diamine having no photosensitive group g (mol) | Acid anhydride g (mol) | Polymer in solution wt% |
|---|---|---|---|---|
| 13 | H₂N—⌬(NH₂)—COCH₂CH₂OCH=CH—Ph, =O  1.63 g (0.005) | H₂N—⌬—O—⌬—NH₂  1.0 g (0.005) | [benzophenone tetracarboxylic dianhydride structure]  (0.01) | N-methyl-2-pyrrolidone 15.0 |
| 14 | H₂N—⌬(NH₂)—COOCH₂—C(H)(OH)—CH₂OCOC(CH₃)=CH₂  2.90 g (0.01) | " | [pyromellitic dianhydride structure]  3.22 g (0.01) | N-methyl-2-pyrrolidone 9.2 |
| 15 | H₂N—⌬(NH₂)—COOR  3.56 g (0.01)  R=CH₂CH₂OC(=O)C(CH₃)=CH₂ | — | [pyromellitic dianhydride structure]  2.18 g (0.01) [pyromellitic dianhydride structure]  1.09 g (0.005) [benzophenone tetracarboxylic dianhydride structure]  1.61 g (0.005) | N-methyl-2-pyrrolidone 15.3 |

TABLE 4

| No. | Intrinsic viscosity of polymer | Sensitizer (wt % based on polymer) | Coating quality (supporting material) | Precision of pattern |
|---|---|---|---|---|
| 8 | 0.77 | 2-methylanthraquinone (8) | good (silicon wafer) | good |
| 9 | 0.85 | Michler's ketone (6) | good (silicon wafer) | good |
| 10 | 0.80 | Michler's ketone (6) | good (silicon wafer) | good |
| 11 | 0.76 | N-acetyl-4-nitro-1-naphthylamine (5) | good (aluminum) | good |
| 12 | 0.61 | N-acetyl-4-nitro-1-naphthylamine (5) | good (ceramic) | good |
| 13 | 0.59 | N-acetyl-4-nitro-1-naphthylamine (5) | good (silicon wafer) | good |
| 14 | 1.38 | 2-methylanthraquinone (6) | good (silicon wafer) | good |
| 15 | 0.61 | Michler's ketone (6) | good (silicon wafer) | good |

TABLE 5

| No. | Diamine having a photosensitive group g (mol) | Diamine having no photosensitive group g (mol) | Acid anhydride g (mol) | Polymer in solution wt % |
|---|---|---|---|---|
| 16 | [structure with NH₂, COOR, R=CH₂CH₂OCCH=CH₂, O] 4.18 g (0.01) | — | [pyromellitic dianhydride structure] 2.18 g (0.01) | N-methyl-2-pyrroli-done 16.1 |
| 17 | [structure with NH₂, COOR, CH₃, R=CH₂CH₂OCCH=CH₂] 2.09 g (0.005) | [H₂N—⌬—O—⌬—NH₂] 1.0 g (0.005) | [pyromellitic dianhydride structure] 1.09 g (0.005) | N-methyl-2-pyrroli-done (15.3) |
| 18 | [structure with NH₂, COOR, R=CH₂CH₂OCCH=CH₂] 3.2 g (0.0076) | [H₂N—⌬—O—⌬—NH₂] 0.48 g (0.0024) | [benzophenone tetracarboxylic dianhydride structure] 1.61 g (0.005) | N-methyl-2-pyrroli-done (15.3) |
| 19 | [structure with NH₂, COOR] 1.63 g (0.005) | — | " | N,N-di-methyl-acet-amide (15.2) |
|    | [structure with NH₂, COOR] 2.09 g (0.005) |   |   |   |
| 20 | [structure with NH₂, COOR, R=CH₂CH₂OCOCH=CH₂] 1.32 g (0.005) | — | " | N-methyl-2-pyrroli-done 16 |
|    | [structure with NH₂, COOR] 1.78 g (0.005) |   |   |   |

TABLE 5-continued

| No. | Diamine having a photosensitive group g (mol) | Diamine having no photosensitive group g (mol) | Acid anhydride g (mol) | Polymer in solution wt % |
|---|---|---|---|---|
| 21 | R=CH₂CH₂OCC=CH₂, OCH₃<br>H₂N–⬡(NH₂)(CH₃)–CH₂OCC=CH₂(=O)<br>2.06 g (0.01) | — | " | N-methyl-2-pyrrolidone 18.0 |
| 22 | H₂N–⬡(NH₂)(CH₃)–CH₂OC–C=CH₂(=O)<br>1.65 g (0.008) | H₂N–⬡–O–⬡–C(CH₃)₂–⬡–O–⬡–NH₂<br>0.82 g (0.0019) | " | |
| 23 | H₂N–⬡(NH₂)(CH₃)–OCC=CH₂(=O)<br>1.92 g (0.01) | — | " | N-methyl-2-pyrrolidone 12.0 |

TABLE 6

| No. | Intrinsic viscosity of polymer | Sensitizer (wt % based on polymer) | Coating quality (supporting material) | Precision of pattern |
|---|---|---|---|---|
| 16 | 0.55 | p,p'-tetramethyl diaminobenzophenone (6) | good (Electrode Pattern: SiO$_x$) | good |
| 17 | 0.63 | 5-nitrofluorene (10) | good | good |
| 18 | 0.58 | 5-nitrofluorene (10) | good (quartz glass) | good |
| 19 | 0.65 | 5-nitroacenaphthene (8) | good (silicon wafer) | good |
| 20 | 0.79 | Benzoin iso-propyl ether (4) | good (silicon wafer) | good |
| 21 | 1.23 | 2-methylanthraquinone (4) | good (silicon wafer) | good |
| 22 | 1.01 | N-acetyl-4-nitro-1-naphthylamine (8) | good (silicon wafer) | good |
| 23 | 0.65 | 2-methylanthraquinone (4) | good (silicon wafer) | good |

TABLE 7

| No. | Diamine having a photosensitive group g (mol) | Diamine having no photosensitive group g (mol) | Acid anhydride g (mol) | Polymer in solution wt % |
|---|---|---|---|---|
| 24 | 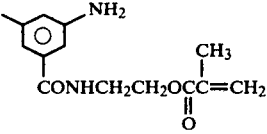 2.63 g (0.01) | — | 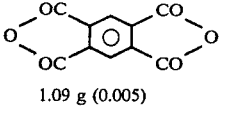 1.09 g (0.005) 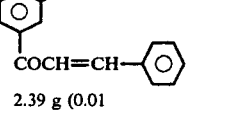 1.61 g (0.005) | N-methyl-2-pyrrolidone 10.0 |
| 25 | 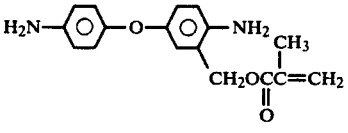 2.39 g (0.01) | — | " | N-methyl-2-pyrrolidone 10.1 |
| 26 | 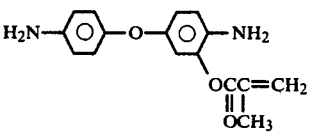 2.98 g (0.01) | — | " | N-methyl-2-pyrrolidone 15.0 |
| 27 | 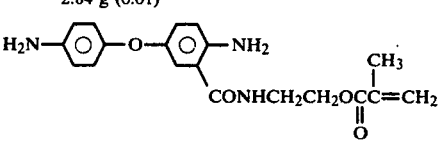 2.84 g (0.01) | — | " | N,N-dimethyl-acetoamide 20.0 |
| 28 | 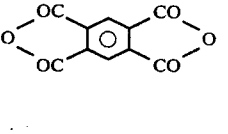 3.55 g (0.01) | — | " | 1,3-dimethyl-2-imidazolidinone 10.0 |
| 29 | " | — | 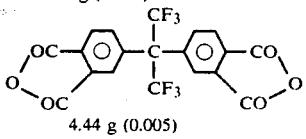 1.09 g (0.005) 4.44 g (0.005) | N-methyl-2-pyrrolidone 14.0 |

TABLE 7-continued

| No. | Diamine having a photo-sensitive group g (mol) | Diamine having no photosensitive group g (mol) | Acid anhydride g (mol) | Polymer in solution wt % |
|---|---|---|---|---|
| 30 | 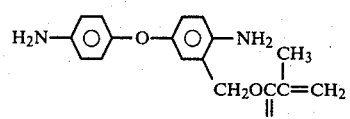 2.39 g (0.008) | 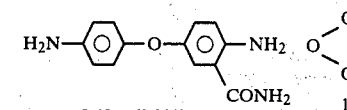 0.48 g (0.002) | 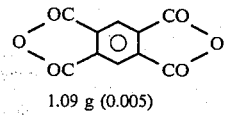 1.09 g (0.005) 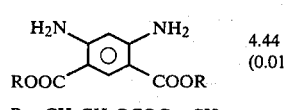 1.01 g (0.005) | N-methyl-2-pyr-rolidone 12.0 |
| 31 | 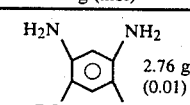 4.44 g (0.01) R=CH$_2$CH$_2$OCOC(CH$_3$)=CH$_2$ | — | " | N-methyl-2-pyr-rolidone 21.0 |

TABLE 8

| No. | Intrinsic viscosity of polymer | Sensitizer (wt % based on polymer) | Coating quality (supporting material) | Precision of pattern |
|---|---|---|---|---|
| 24 | 1.51 | Benzoin iso-propyl ether (8) | good (silicon wafer) | good |
| 25 | 0.89 | 5-nitroacenaphthene (10) | good (silicon nitride) | good |
| 26 | 1.05 | 2-methylanthraquinone (8) | good (ceramic) | good |
| 27 | 0.81 | 2-methylanthraquinone (8) | good (silicon wafer) | good |
| 28 | 0.77 | 2-methylanthraquinone (8) | good (silicon wafer) | good |
| 29 | 0.93 | 2-ethylanthraquinone (8) | good (aluminum) | good |
| 30 | 1.39 | 2-ethylanthraquinone (8) | good (silicon wafer) | good |
| 31 | 0.83 | p,p'-tetramethyl-diaminobenzophenone (5) | good (silicon wafer) | good |

TABLE 9

| No. | Diamine having a photo-sensitive group g (mol) | Diamine having no photosensitive group g (mol) | Acid anhydride g (mol) | Polymer in solution wt% |
|---|---|---|---|---|
| 32 | 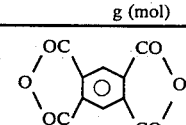 2.76 g (0.01) R=C(O)-C(CH$_3$)=CH$_2$ | — | 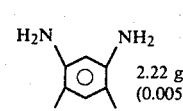 1.09 g (0.005) 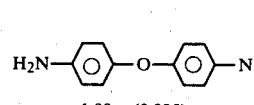 1.61 g (0.005) | N-methyl-2-pyrro-lidone 10.0 |
| 33 | 2.22 g (0.005) ROOH COOR R=CH$_2$CH$_2$OCOC(CH$_3$)=CH$_2$ | H$_2$N-⌬-O-⌬-NH$_2$ 1.00 g (0.005) | " | N-methyl-2-pyrro-lidone 14.0 |

TABLE 9-continued

| No. | Diamine having a photosensitive group g (mol) | Diamine having no photosensitive group g (mol) | Acid anhydride g (mol) | Polymer in solution wt% |
|---|---|---|---|---|
| 34 | 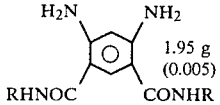 1.95 g (0.005) R=CH₂CH₂OCOCH=CH₂ | — | 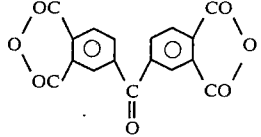 3.22 g (0.01) | N-methyl-2-pyrrolidone 12.0 |
| 35 | 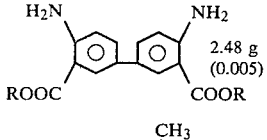 2.48 g (0.005) R=CH₂CH₂OCOC(CH₃)=CH₂ | H₂N—⟨○⟩—O—⟨○⟩—NH₂ 1.00 g (0.005) | " | N-methyl-2-pyrrolidone 20.0 |
| 36 | 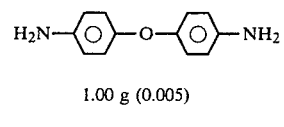 4.10 g (0.008) R=CH₂CH₂OCOC(CH₃)=CH₂ | H₂N—⟨○⟩—SO₂—⟨○⟩—NH₂ 0.49 g (0.0019) | 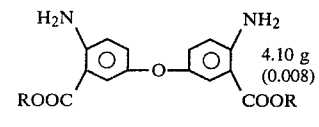 2.18 g (0.01) | N-methyl-2-pyrrolidone 16.0 |
| 37 | 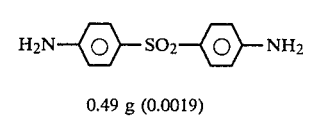 1.84 g (0.005) R=CH₂CH₂OCOC(CH₃)=CH₂ | H₂N—⟨○⟩—O—⟨○⟩—NH₂ 1.00 g (0.005) | 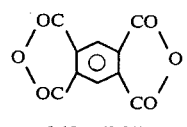 1.09 g (0.005) 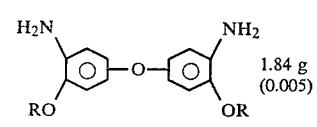 1.61 g (0.05) | N-methyl-2-pyrrolidone 15.0 |
| 38 | 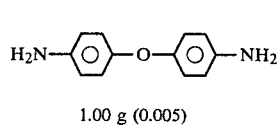 R=CH₂CH₂OCOC(CH₃)=CH₂ 3.02 g (0.005) | " | " | N-methyl-2-pyrrolidone 11.0 |

TABLE 10

| No. | Intrinsic viscosity of polymer | Sensitizer (wt % based on polymer) | Coating quality (supporting material) | Precision of pattern |
|---|---|---|---|---|
| 32 | 0.99 | p,p'-tetramethyl-diaminobenzophenone (5) | good (quartz glass) | good |
| 33 | 0.94 | 2-methylanthraquinone (7) | good (silicon wafer) | good |
| 34 | 0.78 | 2-methylanthraquinone (7) | good (silicon wafer) | good |
| 35 | 1.11 | 5-nitroacenaphthene (9) | good (SiO$_x$ glass) | good |
| 36 | 1.09 | Michler's ketone (5) | good (silicon wafer) | good |
| 37 | 0.80 | Michler's ketone (5) | good (silicon wafer) | good |
| 38 | 0.58 | Michler's ketone (5) | good (silicon wafer) | good |

We claim:

1. A photosensitive polymer composition characterized in that it is a blend of a photosensitive polyamide acid intermediate solution and a sensitizer therefor, the solution containing 0.1 to 40% by weight of a polyamide acid and 99.9 to 60% by weight of an organic solvent, with the sensitizer in an amount of 0.5 to 20% by weight based on the polyamide acid, said polyamide acid having a repeating unit of the formula

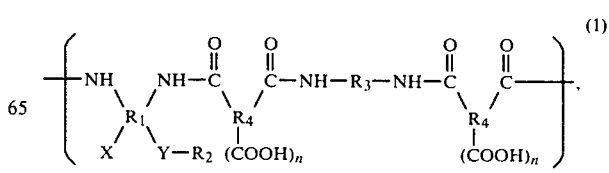

(1)

and being obtained from a diamine, having a photosensitive group, of the formula

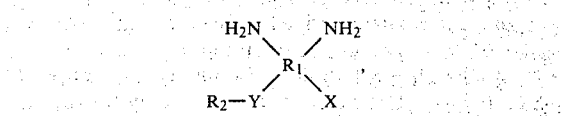

a diamine, having no photosensitive group, of the formula

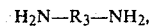

and at least one compound of a tetracarboxylic acid dianhydride and a tricarboxylic acid anhydride monohalide, the proportion of the former diamine and the latter diamine used being 100 to 5% by weight and 0 to 95% by weight, respectively;

in all of the formulae $R_1$ is a trivalent or tetravalent group having at least 2 carbon atoms, $R_2$ is a photosensitive group having an ethylenically unsaturated bond, $R_3$ is a divalent group having at least two carbon atoms and the adjacent two amino groups are bound to different carbon atoms in $R_3$, $R_4$ is a tetravalent group having at least 4 carbon atoms and/or a trivalent group having at least 2 carbon atoms, Y is a group selected from the group consisting of —COO—, CONH—, —CO—, —O—, and —CH$_2$O—, X is a hydrogen atom or —Y—R$_2$, and n is 1 or 2.

2. A photosensitive polymer composition according to claim 1, characterized in that the photosensitive group for $R_2$ is:

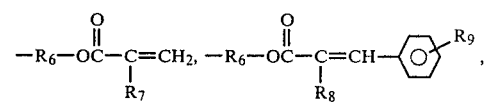

when Y is —COO— or —CONH;

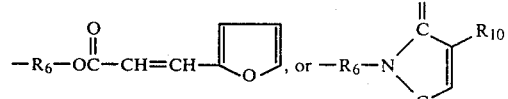

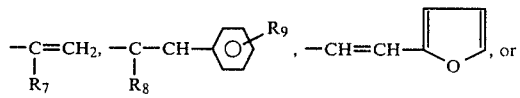

when Y is —CO—;

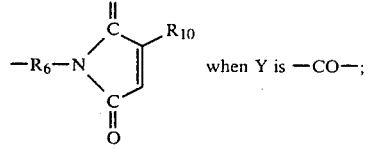

and

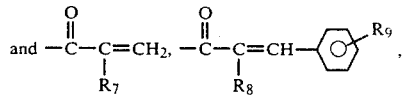

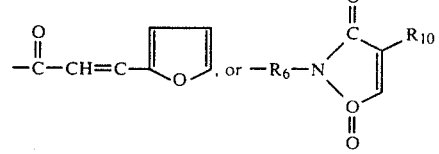

when Y is —CH$_2$O— or —O—;

wherein $R_6$ is an alkylene group or a hydroxyalkylene group, $R_7$ is H atom or methyl group, $R_8$ is H atom or cyano group, $R_9$ is H atom, a halogen atom, an alkyl group, or an alkoxy group, and $R_{10}$ is H atom or a phenyl group.

3. A photosensitive polymer composition characterized in that it is a blend of a photosensitive polyamide acid intermediate solution and a sensitizer therefor, the solution containing 0.1 to 40% by weight of a polyamide acid and 99.9 to 60% by weight of an organic solvent, with the sensitizer in an amount of 0.5 to 20% by weight based on the polyamide acid, said polyamide acid having a repeating unit of the formula

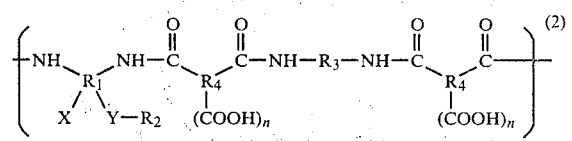

and being obtained from a diamine, having a photosensitive group, of the formula

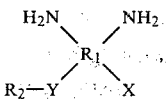

a diamine, having no photosensitive group, of the formula

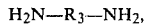

and at least one compound of a tetracarboxylic acid dianhydride and a tricarboxylic acid anhydride monohalide, the proportion of the former diamine and the latter diamine used being 100 to 60% by weight and 0 to 40% by weight, respectively;

in all of the formulae $R_1$ is a trivalent or tetravalent group having at least 2 carbon atoms, $R_2$ is a photosensitive group having an ethylenically unsaturated bond, $R_3$ is a divalent group having at least two carbon atoms and the adjacent two amino groups are bound to different carbon atoms in $R_3$, $R_4$ is a tetravalent group having at least 4 carbon atoms and/or a trivalent group having at least 2 carbon atoms, Y is a group selected from the group consisting of —COO—, CONH—, —CO—, —O—, and CH$_2$O—, X is a hydrogen atom or —Y—R$_2$, and n is 1 or 2.

4. A photosensitive polymer composition according to claim 3, characterized in that the photosensitive group for $R_2$ is:

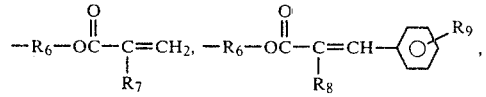

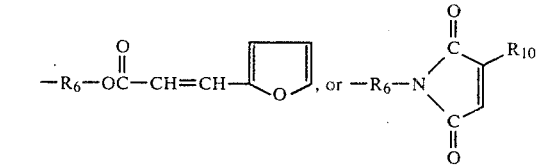

when Y is —COO— or —CONH;

-continued

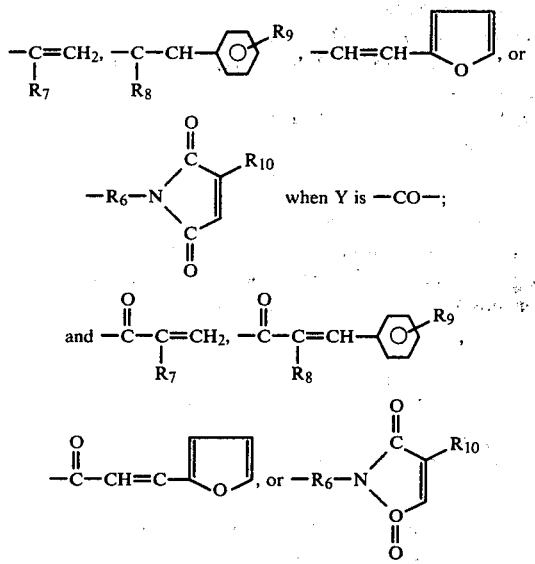

when Y is —CH₂O— or —O—;

wherein $R_6$ is an alkylene group or a hydroxyalkylene group, $R_7$ is H atom or methyl group, $R_8$ is H atom or cyano group, $R_9$ is H atom, a halogen atom, an alkyl group, or an alkoxy group, and $R_{10}$ is H atom or a phenyl group.

5. A photosensitive polymer composition according to claim 1 or 3, characterized in that the organic solvent is at least one solvent selected from the group consisting of N-methyl-2-pyrrolidone, 1,3-dimethyl-2-imidazolidinone, N,N-dimethylacetamide, N-methylformamide, N,N-dimethylformamide, dimethyl sulfoxide, hexamethylphosphoramide, tetramethylene sulfone, dimethyl sulfone, pyridine, tetramethylurea, and N-acetyl-2-pyrrolidone.

6. A photosensitive polymer composition according to claim 5, characterized in that the organic solvent further includes benzene, toluene, nitrotoluene, chlorobenzene, or cyclohexanone.

7. A photosensitive polymer composition according to claim 1 or 3, characterized in that the sensitizer is at least one of the group consisting of anthraquinone, 2-methyl-anthraquinone, 2-ethylanthraquinone, benzoquinone, 1,2-naphthoquinone, 1,4-naphthoquinone, 1,2-benzoanthraquinone, acetophenone, benzophenone, p,p'-diamino-benzophenone, p,p'-dimethylamino benzophenone, p,p'-tetramethyldiaminobenzophenone, 2-nitrofluorene, 5-nitroacenaphthene, 4-nitro-1-naphthylamine, N-acetyl-4-nitro-1-naphthylamine, p-nitroaniline, 2-chloro-4-nitroaniline, pycramide, 2-t-butylanthraquinone, 1,2-benzanthraquinone, anthrone, 1,9-benzo-anthrone, 3-methyl-1, 3-diaza-1,9-benzoanthrone, and dibenzalacetone.

* * * * *